United States Patent [19]

Iwasaki

[11] Patent Number: 4,745,311
[45] Date of Patent: May 17, 1988

[54] SOLID-STATE RELAY

[75] Inventor: Yuzo Iwasaki, Arita, Japan

[73] Assignee: Omron Tateisi Electronics Co., Kyoto, Japan

[21] Appl. No.: 44,482

[22] Filed: May 1, 1987

[30] Foreign Application Priority Data

May 7, 1986 [JP] Japan ................................ 61-104397

[51] Int. Cl.⁴ .................... H03K 17/72; H03K 17/687
[52] U.S. Cl. .................................. 307/632; 307/570; 307/571; 307/597; 307/311
[58] Field of Search ............... 307/311, 632, 643, 596, 307/597, 599, 601, 605, 570, 571

[56] References Cited

U.S. PATENT DOCUMENTS 4,129,785 12/1978 Kadah .
4,390,790 6/1983 Rodriguez ........................... 307/311
4,408,131 10/1983 Fox ....................................... 307/311
4,564,770 1/1986 Sherman et al. .

OTHER PUBLICATIONS

European Search Report of E.P. Appln. No. 87106587.6, dated Aug. 3, 1987.
Patent Abstracts of Japan, vol. 6, No. 64, Y. Ishigami, Apr. 23, 1982.

Primary Examiner—John Zazworsky
Attorney, Agent, or Firm—Wegner & Bretschneider

[57] ABSTRACT

A solid-state relay having a photo-coupler for controlling supply of AC power to a load is improved so as to eliminate the problem of counterelectromotive force which could happen when the load contains an inductive component and the power to the load is turned off. The solid-state relay of the present invention typically comprises a first and a second light emitting diode which are adapted to be lighted up by an input signal; a photo-diode which is optically coupled to the first light emitting diode and is adapted to selectively supply AC electric power from a power source to the load depending on whether the light from the first light emitting diode is being received or not; a photo-triac which is optically coupled to the second light emitting diode and is adapted to supply the AC electric power from the power source to the load depending on whether the light from the second light emitting diode is being received or not; a time delay circuit which maintains the second light emitting diode lighted up for a certain time interval after the input signal is terminated; and a triac for terminating the supply of the AC electric power to the load when voltage of the power source is below a certain level.

7 Claims, 2 Drawing Sheets (a) POWER SOURCE VOLTAGE (b) INPUT SIGNAL (c) LOAD CURRENT

SOLID-STATE RELAY

TECHNICAL FIELD

This invention relates to a solid-state relay and in particular to an improvement of a solid-state relay using a field effect transistor (which is referred to as FET hereinafter).

BACKGROUND OF THE INVENTION

Typically, in a solid-state relay, an input circuit and an output circuit are electrically isolated from each other by a photo-coupler, and a load is selectively connected and disconnected to the output circuit according to a signal supplied to the input circuit.

In a solid-state relay of this type, a semiconductor switching element such as a triac has been typically used and FET's have lately come to be preferred as such a switching element. This is because an FET presents comparatively less electric resistance when it is in a conductive state than a triac in the same state and therefore generates less heat. As a result, an FET requires smaller heat dissipating fins and can reduce the overall size of the solid-state relay.

FIG. 3 shows a conventional solid-state relay circuit which makes use of an FET.

In the drawing, a resistor 3 for limiting current and a light emitting diode 4 of a photo-coupler 6 are connected in series across a pair of input terminals 1 and 2. The photo-coupler 6 further comprises a plurality of photo-diodes 5 which are connected in series with each other and are optically coupled to the light emitting diode 4. An input circuit 100 and an output circuit 200 are electrically isolated from each other by this photo-coupler 6. Numeral 7 denotes a resistor which is connected in parallel with the photo-diodes 5.

A pair of FET's 8 and 9 are connected in series with each other, with their sources connected in common. The drains of the FET's 8 and 9 are connected to a load 12 and an AC power source 13 in such a manner that the load, the power source 13 and the FET's 8 and 9 are connected in series in a closed circuit. The cathode of a diode 10 is connected to the drain of the FET 8 and the anode of the diode 10 is connected to the source of the FET 8. Likewise, the cathode of a diode 11 is connected to the drain of the FET 9 and the anode of the diode 11 is connected to the source of the FET 9.

The sources of the FET's 8 and 9 which are connected in common are further connected to the anode of the photo-diodes 5 and the gates of the FET's 8 and 9 are connected in common to the cathode of the photo-diodes 5.

The action of the circuit of FIG. 3 is as follows:

When there is no input signal applied across the input terminals 1 and 2, the light emitting diode 4 does not light up and therefore no electromotive force is produced in the photo-diodes 5. Therefore, the FET's 8 and 9 are both off and no electric power is transmitted to the load 12.

When an input signal is applied across the input terminals 1 and 2, electric current is supplied to the light emitting diode 4 and the light emitting diode 4 lights up. This light is transmitted to the photo-diodes 5 by way of the photo-coupler 6, producing an electromotive force in the photo-diodes 5. As a result, a certain electric voltage is produced across the resistor 7 and applied across the sources and the gates of the FET's 8 and 9, respectively.

Therefore, the FET 8 turns ON during the positive half period of the power source 13 and electric power is transmitted to the load 12 by way of the FET 8 and the diode 11 which is connected across the source and the drain of the FET 9. During the negative half period of the power source 13, the FET 9 turns ON and electric power is transmitted to the load 12 by way of the FET 9 and the diode 10 which is connected across the source and the drain of the FET 10. Thus, the load receives electric power irrespective of the polarity of the power source at each moment and remains in this state throughout the time a signal is supplied to the input circuit 100.

FIG. 4 is a waveform diagram showing the above described action; FIG. 4 (a) shows a power source voltage, FIG. 4 (b) shows an input signal applied across the input terminals 1 and 2, and FIG. 4 (c) shows the electric current flowing through the load 12.

However, according to this conventional circuit, since the FET's 8 and 9 turn off immediately after the input signal has disappeared and the electromotive force of the photo-diodes 5 has been lost, if the input signal turns OFF near a peak P of the power source voltage waveform shown in FIGS. 4 (a) and 4 (c), the load current abruptly turns OFF. Therefore, if the load 12 includes an inductive component, a counterelectromotive force is produced and this could cause destruction of the FET's 8 and 9 and the diodes 10 and 11 and generation of electric noises which may interfere with radio communication.

SUMMARY OF THE INVENTION

This invention was made in view of such problems of the prior art and its primary object is to provide a solid-state relay which does not generate counterelectromotive force even when the input signal is abruptly turned off near a peak of the power source voltage and is thereby highly reliable without causing destruction of electronic devices or generation of noises.

According to the present invention, this and other objects of the present invention can be accomplished by providing a solid-state relay, comprising: a first and a second light emitting element which are adapted to be lighted up by an input signal; a first light receiving element which is optically coupled to the first light emitting element and is adapted to selectively supply AC electric power from a power source to a load depending on whether the light from the first light emitting element is being received or not; a second light receiving element which is optically coupled to the second light emitting element and is adapted to supply the AC electric power from the power source to the load depending on whether the light from the second light emitting element is being received or not; and a time delay means which maintains the second light emitting element lighted up for a certain time interval after the input signal is terminated; the second light receiving element comprises a means for terminating the supply of the AC electric power to the load when the voltage of the power source is below a certain level.

According to this structure, since the second light emitting element continues to light up by the time delay means even when the input signal has disappeared and the FET is turned off, the second light receiving element continues ON and this state is maintained until the load current is reduced to a low level or zero. Therefore, even when the input signal has been turned OFF near a peak of the power source voltage, the load current would not abruptly disappear and the generation of counterelectromotive force is avoided with the result that destruction of electronic devices and emission of electric noises can be prevented.

According to a certain aspect of the present invention, the light emitting elements comprise a pair of light emitting diodes which are connected in series and the time delay means comprises a time constant circuit which is connected in parallel with the light emitting diode which corresponds to the second light emitting element.

According to another aspect of the present invention, the first light receiving element comprises a photo-diode and a a FET which is controlled by the output of the photo-diode.

According to yet another aspect of the present invention, the second light receiving element comprises a photo-triac and a triac or an SCR which is controlled by the photo-triac.

BRIEF DESCRIPTION OF THE DRAWINGS

The present invention will now be shown and described in the following in terms of a concrete embodiment thereof with reference to the appended drawings, in which.

DETAILED DESCRIPTION OF THE PREFERRED EMBODIMENT

Figure 1:
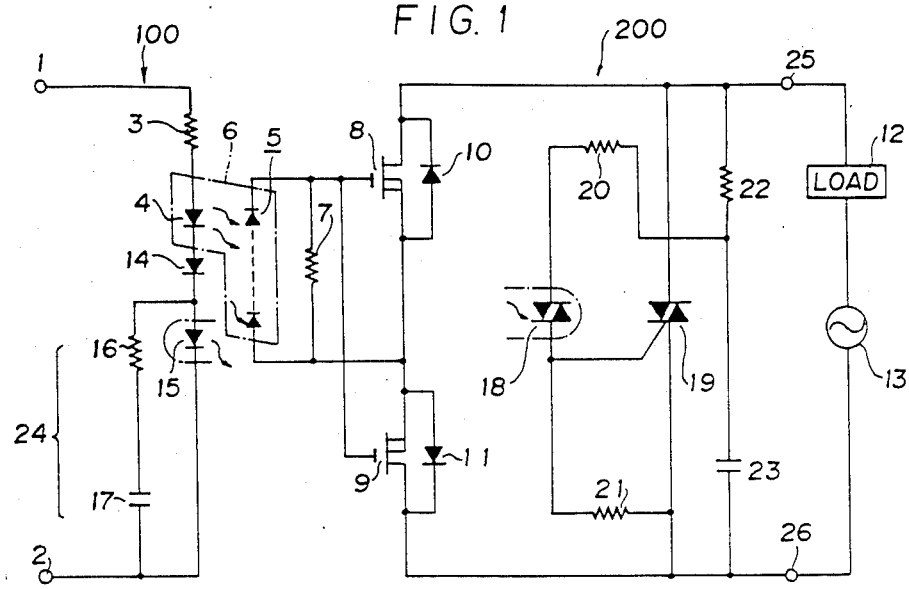
FIG. 1 is a circuit diagram showing an embodiment of the solid-state relay of the present invention.

Now an embodiment of the present invention is described in the following with reference to the appended drawings.

In the drawing, a resistor 3 for limiting current, a light emitting diode 4 of a photo-coupler 6, a diode 14 and another light emitting diode 15 are connected in series across a pair of input terminals 1 and 2. The light emitting diode 15 is bypassed by a time constant circuit 24 having a resistor 16 and a capacitor 17 which are connected in series with each other. The photo-coupler 6 further comprises a plurality of photo-diodes 5 which are connected in series with each other and are optically coupled to the light emitting diode 4. An input circuit 100 and an output circuit 200 are electrically isolated from each other by this photo-coupler 6. Numeral 7 denotes a resistor which is connected in parallel with the photo-diodes 5.

A pair of FET's 8 and 9 are connected in series with each other, with their sources connected in common. The drains of the FET's 8 and 9 are connected to a load 12 and an AC power source 13 in such a manner that the load, the power source 13 and the FET's 8 and 9 are connected in series in a closed circuit. The cathode of a diode 10 is connected to the drain of the FET 8 and the anode of the diode 10 is connected to the source of the FET 8. Likewise, the cathode of a diode 11 is connected to the drain of the FET 9 and the anode of the diode 11 is connected to the source of the FET 9. Numeral 7 denotes a resistor which is connected in parallel with the photo-diodes 5.

Numerals 8 and 9 denote a pair of FET's which are connected in series with each other, and the gate of the FET 8 is connected to the node between the cathode of the photo-diodes 5 and the resistor 7 as well as to the gate of the FET 9. The source of the FET 8 is connected to the node between the anode of the photo-diodes 5 and the resistor 7 as well as to the source of the FET 9. Numerals 10 and 11 denote diodes which are connected across the sources and the drains of the respective FET's 8 and 9, and numerals 12 and 13 denote a power source and a load, respectively, which are connected in series with the FET's 8 and 9.

Numeral 18 denotes a photo-triac which is optically coupled to the light emitting diode 15 while numeral 19 denotes a triac which is controlled by the photo-triac 18. The triac 19 is connected in parallel with the FET's 8 and 9 across a pair of load terminals 25 and 26. One of the main electrodes of the photo-triac 18 is connected, by way of a resistor 20, to a node between a resistor 22 and a capacitor 23 which are connected across the load terminals 25 and 26 while the other main electrode of the photo-triac 18 is connected to the gate of the triac 19. A resistor 21 is connected between the gate of the triac 19 and one of the main electrodes thereof. Further, a load 12 and an AC power source 13 are connected in series across the load terminals 25 and 26.

Now the action of the circuit of FIG. 1 is described in the following:

When there is no input signal across the input terminals 1 and 2, the light emitting diode 4 would not light up and, therefore, no electromotive force is generated in the photo-diodes 5. As a result, both the FET's 8 and 9 remain in the OFF state. Since the light emitting diode 15 is also not lighted up, the photo-triac 18 and the triac 19 are both in the OFF state. Further, since the impedance of the resistor 22 and the capacitor 23 is extremely high, almost no current is directed to the resistor 22 and the capacitor 23. As a result, no electric current is supplied to the load 12.

When an input signal is applied across the input terminals 1 and 2, since the light emitting diode 4 receives electric current from the input signal by way of the resistor 3, the light emitting diode 4 lights up. This light is transmitted to the photo-diodes 5 by way of the photo-coupler 6 and the photo-diodes 5 produce an electromotive force. As a result, a certain electric voltage is produced across the resistor 7 and applied across the sources and the gates of the FET's 8 and 9, respectively.

Thus, the FET 8 turns ON during the positive half period of the power source 13 and electric power is transmitted to the load 12 by way of the FET 8 and the diode 11. During the negative half period of the power source 13, the FET 9 turns ON and electric power is transmitted to the load 12 by way of the FET 9 and the diode 10.

When there is an input signal, the capacitor 17 of the time constant circuit 24 is charged up and the light emitting diode 15 lights up. The diode 14 fixes the direction of the electric current that is to be supplied to the capacitor 17 when the time constant circuit 24 is being charged. The lighted light emitting diode 15 turns on the photo-triac 18. However, since the electric resistances of the FET's 8 and 9 when they are in the conductive state are so small that most of the load current flows through the FET's 8 and 9 and no electric current is supplied to the gate of the triac 19 by way of the photo-triac 18. Therefore, the triac 19 remains in the OFF state.

When the input signal has disappeared, the light emitting diode 4 immediately stops emitting light and the photo-diodes 5 lose their electromotive force. The electric charge stored in the capacitor 17 of the time constant circuit 24 is then discharged through the resistor 16 and the light emitting diode 15 and the light emitting diode 15 continues to emit light by feeding upon this discharge current. As a result, the photo-triac 18 remains turned on and as electric current continues to be supplied to the gate of the triac 19 from the power source 13 by way of the resistors 22 and 20 and the photo-triac 18, the triac 19 turns on. This ON state of the triac 19 is maintained until the load current is reduced to zero by virtue of the retaining nature of the triac 19.

Figure 2:
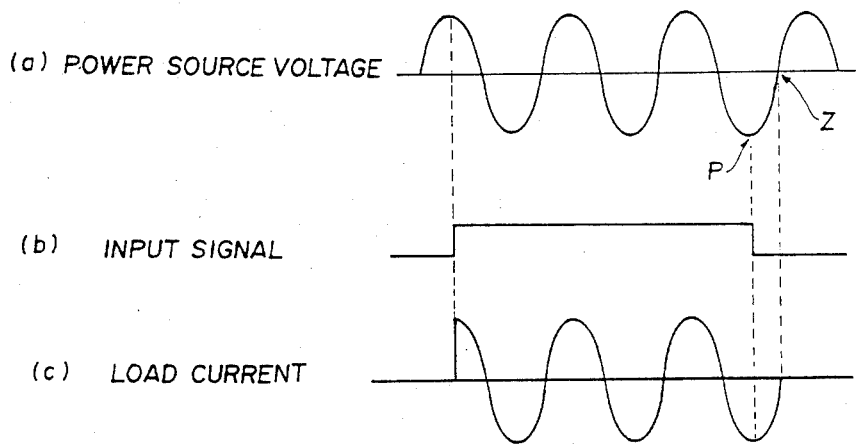
FIG. 2, (a) to (c) are waveform diagrams explaining the action of the circuit of FIG. 1, FIG. 2(a) showing the power source voltage, FIG. 2(b) showing the input signal and FIG. 2(c) showing the load current.
Figure 3:
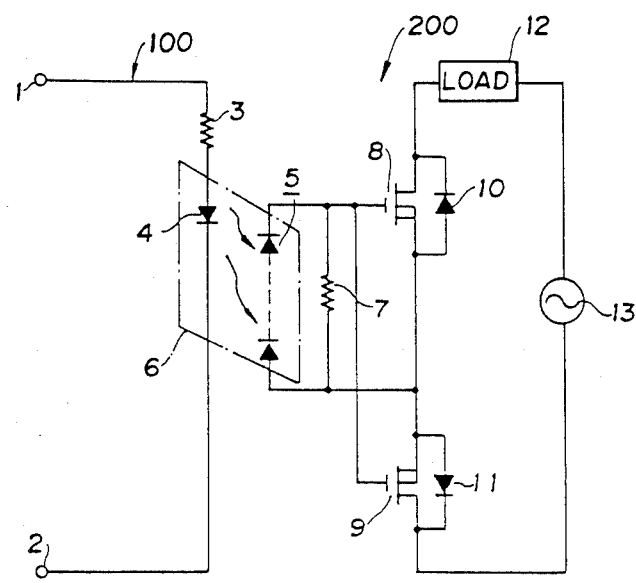
FIG. 3 is a circuit diagram showing a conventional solid-state relay.
Figure 4:
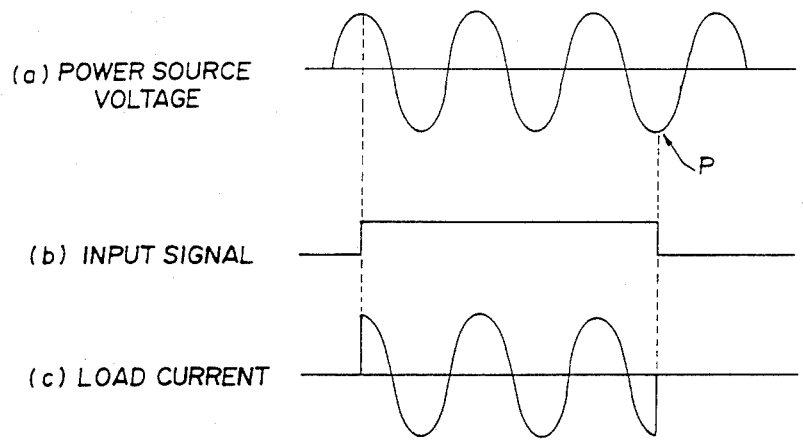
FIG. 4, (a) to (c) are waveform diagrams explaining the action of the circuit of FIG. 3, FIG. 4(a) showing the power source voltage, FIG. 4(b) showing the input signal and FIG. 4(c) showing the load current.

FIG. 2 is a waveform diagram showing the above described action; FIG. 4 (*a*) shows a power source voltage, FIG. 4 (*b*) shows an input signal applied across the input terminals, and FIG. 4 (*c*) shows the electric current flowing through the load 12. By comparing FIGS. 2 (*c*) and 4 (*c*), it can be seen that, according to the present invention, the load current does not drop from a certain level but stops only when its level crosses a zero value. Thereby, even when the load contains an inductive component, the problem of counterelectromotive force will not arise.

Thus, according to the above described circuit, since, even when the input signal has disappeared near a peak P of the power source voltage as shown in FIGS. 2 (*a*) and 2 (*b*), the load current does not drop to zero at this moment but the load current persists up to a time point Z, the change in the electric current flowing through the load 12 when the input signal turns off is reduced and, thereby, destruction of electronic devices and emission of electric noises can be prevented even if the load 12 includes an inductive component.

In the above described embodiment, the case in which the input signal turns ON was not considered because the influence of counterelectromotive force due to an inductive load is much less when the input signal turns ON than when the input signal turns OFF. However, that may also be accounted for according to the spirit of the present invention.

Also, in the above described embodiment, the triac 19 was controlled by the photo-triac 18 but if the photo-triac has an adequate current control capability the photo-triac 18 can directly control the load current without using an additional triac such as the triac 19.

Further, although the triac 19 was used as a semiconductor switching element in the above described embodiment, it may also be an SCR (silicon controlled rectifying) element.

Although the present invention has been shown and described with reference to the preferred embodiment thereof, it should not be considered as limited thereby. Various possible modifications and alterations could be conceived of by one skilled in the art to any particular embodiment, without departing from the scope of the invention.

What I claim is:

1. A solid-state relay, comprising:
    a first and a second light emitting element which are adapted to be lighted up by an input signal;
    a first light receiving element which is optically coupled to the first light emitting element and is adapted to selectively supply AC electric power from a power source to a load depending on whether the light from the first light emitting element is being received or not;
    a second light receiving element which is optically coupled to the second light emitting element and is adapted to supply the AC electric power from the power source to the load depending on whether the light from the second light emitting element is being received or not; and
    a time delay means which maintains the second light emitting element lighted up for a certain time interval after the input signal is terminated;
    the second light receiving element comprises a means for terminating the supply of the AC electric power to the load when the voltage of the power source is below a certain level.

2. A solid-state relay as defined in claim 1, wherein the light emitting elements comprise a pair of light emitting diodes which are connected in series.

3. A solid-state relay as defined in claim 2, wherein the time delay means comprises a time constant circuit which is connected in parallel with the light emitting diode which corresponds to the second light emitting element.

4. A solid-state relay as defined in claim 3, wherein the first light receiving element comprises a photo-diode and an FET which is controlled by the output of the photo-diode.

5. A solid-state relay as defined in claim 4, wherein the second light receiving element comprises a photo-triac.

6. A solid-state relay as defined in claim 5, wherein the second light receiving element further comprises a triac which is controlled by the photo-triac.

7. A solid-state relay as defined in claim 5, wherein the second light receiving element further comprises a SCR which is controlled by the photo-triac.

* * * * *